United States Patent
Minemura et al.

(10) Patent No.: US 9,190,147 B2
(45) Date of Patent: Nov. 17, 2015

(54) RESISTANCE CHANGING MEMORY WITH A FIRST DRIVER CLOSER THAN A SECOND DRIVER

(71) Applicant: Kabushiki Kaisha Toshiba, Minato-ku (JP)

(72) Inventors: Yoichi Minemura, Yokkaichi (JP);
Takayuki Tsukamoto, Yokkaichi (JP);
Hiroshi Kanno, Yokkaichi (JP);
Takamasa Okawa, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 127 days.

(21) Appl. No.: 13/969,835

(22) Filed: Aug. 19, 2013

(65) Prior Publication Data

US 2014/0219004 A1    Aug. 7, 2014

Related U.S. Application Data

(60) Provisional application No. 61/761,409, filed on Feb. 6, 2013.

(30) Foreign Application Priority Data

Aug. 14, 2013    (JP) ................................ 2013-168430

(51) Int. Cl.
*G11C 7/12*    (2006.01)
*G11C 8/08*    (2006.01)
(Continued)

(52) U.S. Cl.
CPC ............ *G11C 13/0069* (2013.01); *G11C 5/025* (2013.01); *G11C 13/0002* (2013.01);
(Continued)

(58) Field of Classification Search
CPC ....................... G11C 13/0002–13/0019; G11C 13/0026–13/0028; G11C 2013/0078; G11C 11/16; G11C 11/165–11/1657; G11C 11/1675
See application file for complete search history.

(56) References Cited

U.S. PATENT DOCUMENTS 5,528,552 A  *  6/1996  Kamisaki .................... 365/238.5
6,594,176 B2  *  7/2003  Lammers ....................... 365/171
(Continued)

FOREIGN PATENT DOCUMENTS

JP    2006-302407         11/2006
JP    2010027178 A  *    2/2010
(Continued)

*Primary Examiner* — Harry W Byrne
*Assistant Examiner* — Lance Reidlinger
(74) *Attorney, Agent, or Firm* — Oblon, McClelland, Maier & Neustadt, L.L.P.

(57) ABSTRACT

A memory cell array comprises memory cells disposed at intersections of a plurality of first lines disposed in parallel and a plurality of second lines disposed intersecting the first lines. The memory cell includes a variable resistance element. A set operation-dedicated first driver circuit, when executing on the memory cell a set operation for switching a memory cell from a high-resistance state to a low-resistance state, supplies a voltage to the first lines. A reset operation-dedicated first driver circuit, when executing on the memory cell a reset operation for switching the memory cell from a low-resistance state to a high-resistance state, supplies a voltage to the first lines.
A length of a wiring line between the set operation-dedicated first driver circuit and the memory cell array is longer compared to a length of a wiring line between the reset operation-dedicated first driver circuit and the memory cell array.

19 Claims, 9 Drawing Sheets

(51) Int. Cl.
  *G11C 13/00* (2006.01)
  *G11C 5/02* (2006.01)
  *H01L 45/00* (2006.01)
  *H01L 27/24* (2006.01)

(52) U.S. Cl.
  CPC ........ *G11C13/0023* (2013.01); *G11C 13/0026* (2013.01); *G11C 13/0028* (2013.01); *G11C 13/0097* (2013.01); *H01L 27/2436* (2013.01); *H01L 27/2463* (2013.01); *H01L 27/2481* (2013.01); *H01L 45/04* (2013.01); *H01L 45/06* (2013.01); *H01L 45/08* (2013.01); *H01L 45/085* (2013.01); *H01L 45/10* (2013.01); *H01L 45/1233* (2013.01); *G11C 13/0004* (2013.01); *G11C 13/0007* (2013.01); *G11C 13/0011* (2013.01); *G11C 2213/71* (2013.01); *G11C 2213/72* (2013.01)

(56) References Cited

U.S. PATENT DOCUMENTS

| | | | |
|---|---|---|---|
| 8,040,709 | B2 | 10/2011 | Maejima |
| 2010/0214818 | A1* | 8/2010 | Kitagawa et al. ............. 365/148 |
| 2011/0044090 | A1 | 2/2011 | Terada et al. |
| 2011/0280057 | A1* | 11/2011 | Kim et al. ..................... 365/148 |
| 2012/0069627 | A1 | 3/2012 | Minemura et al. |

FOREIGN PATENT DOCUMENTS

| | | |
|---|---|---|
| JP | 2010-102776 | 5/2010 |
| JP | 2011-44193 | 3/2011 |
| JP | 2012-69178 | 4/2012 |
| JP | 2013-109796 | 6/2013 |

\* cited by examiner

RESISTANCE CHANGING MEMORY WITH A FIRST DRIVER CLOSER THAN A SECOND DRIVER

CROSS-REFERENCE TO RELATED APPLICATIONS

This application is based upon and claims the benefit of priority from the prior U.S. provisional Patent Application No. 61/761,409, filed on Feb. 6, 2013 and Japanese Patent Application No. 2013-168430, filed on Aug. 14, 2013, the entire contents of which are incorporated herein by reference.

FIELD

This invention relates to a nonvolatile semiconductor memory device.

BACKGROUND

In recent years, resistance changing memory has been receiving attention as a successor candidate of flash memory. A memory cell in a resistance-changing memory includes a variable resistance element and changes between a high-resistance state and a low-resistance state to store data based on that resistance state. In many cases, the resistance-changing memory is configured by disposing such a memory cell having a variable resistance element, at intersections of a plurality of bit lines and a plurality of word lines (cross-point type).

Such a cross-point type resistance-changing memory has the following problem, namely that depending on a distance between a selected memory cell which is to be a target of a write operation (set operation) or an erase operation (reset operation), and a driver circuit of that selected memory cell, a parasitic resistance changes, whereby voltage application conditions differ. Such a difference in voltage application conditions, as well as increasing a load on the memory cell and deteriorating data storing characteristics, leads to reduce a performance of a memory device.

DETAILED DESCRIPTION

A memory cell array in a nonvolatile semiconductor memory device according to an embodiment described below comprises memory cells disposed at intersections of a plurality of first lines disposed in parallel and a plurality of second lines disposed intersecting the first lines. The memory cell includes a variable resistance element.

A first driver circuit for set operation, when executing on the memory cell a set operation for switching a memory cell from a high-resistance state to a low-resistance state, supplies a voltage to the first lines. A first driver for reset operation circuit, when executing on the memory cell a reset operation for switching the memory cell from a low-resistance state to a high-resistance state, supplies a voltage to the first lines.

A length of a wiring line between the first driver circuit for set operation and the memory cell array is longer compared to a length of a wiring line between the first driver circuit for reset operation and the memory cell array.

Embodiments of a nonvolatile semiconductor memory device according to the present embodiment are described in detail below with reference to the drawings.

First Embodiment

First, a nonvolatile semiconductor memory device according to a first embodiment is described in detail with reference to the drawings.

[Overall Configuration]

Figure 1:
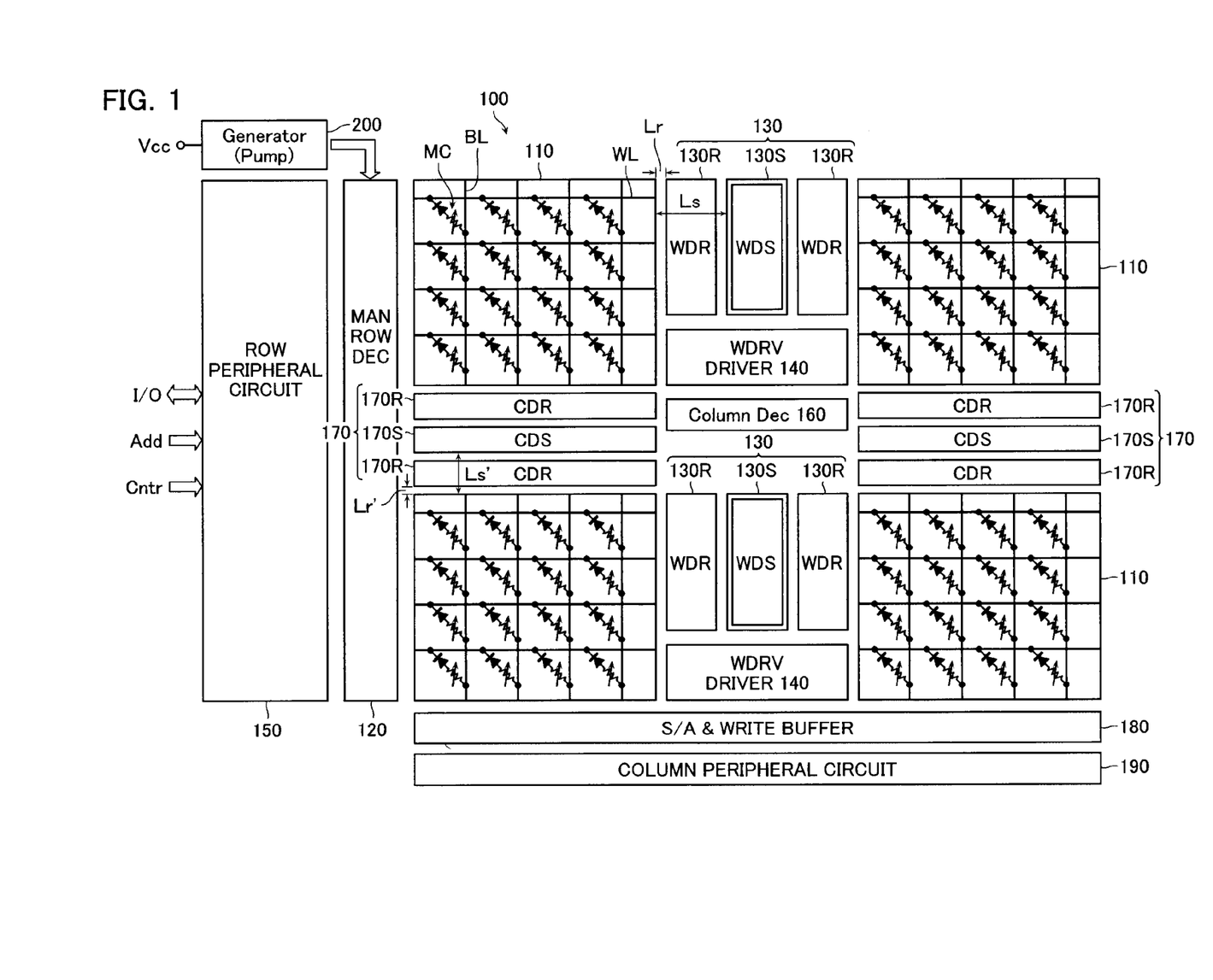
FIG. 1 is an example of a block diagram of a nonvolatile memory according to a first embodiment.

FIG. 1 is an example of a block diagram of a nonvolatile memory according to the first embodiment.

This nonvolatile memory includes a memory cell array core unit 100 surrounded by the dashed line in FIG. 1, and a power supply circuit 200 for generating and supplying a voltage employed in this memory cell array core unit 100.

The memory cell array core unit 100 comprises a memory cell array 110 and a row system control circuit and column system control circuit. This memory cell array 110 is configured from a plurality of word lines WL extending in a row direction, a plurality of bit lines BL extending in a column direction intersecting these word lines WL, and a plurality of memory cells MC provided at intersections of these word lines WL and bit lines BL. In FIG. 1, the memory cell array core unit 100 is configured having four memory cell arrays 110 disposed in a matrix therein, but a disposition of the plurality of memory cell arrays is not limited to this configuration.

The word lines WL are divided into a plurality of groups of a certain number by main word lines (not illustrated in FIG. 1). Similarly, the bit lines BL are also divided into a plurality of groups of a certain number by column select lines (not illustrated in FIG. 1).

In addition, the memory cell array core unit 100 comprises the row system control circuit and column system control circuit that select a certain memory cell in the memory cell array 110, based on an address signal (Add) and a control signal (Cntr) supplied from external, and execute any one of set/reset/read operations.

The row system control circuit includes a main row decoder 120, a row driver 130, a write drive line (WDRV) driver 140, and a row system peripheral circuit 150. The main row decoder 120 selects a certain main word line based on the address signal. The row driver 130 supplies, depending on a selected/unselected state of the main word line, a voltage required for a set operation or the like, to a certain number of the word lines corresponding to the main word line. The write drive line driver 140 prepares a voltage to be supplied to the word line by the word line driver 130, based on the address signal. The row system peripheral circuit 150 includes other required row system circuits.

In addition, the row driver 130 comprises a row driver for set operation 130S and a row driver for reset operation 130R. The row driver for set operation 130S supplies to a certain number of the word lines WL a voltage for a set operation, during the set operation. The row driver for reset operation 130R supplies to a certain number of the word lines WL a voltage for a reset operation, during the reset operation. The row driver for set operation 130S and the row driver for reset operation 130R operate selectively based on a control signal provided by the row system peripheral circuit 150. Moreover, the row driver for set operation 130S is disposed at a position which is far as viewed from the memory cell array 110, compared to the row driver for reset operation 130R. That is, a length Ls of a wiring line L between the row driver for set operation 130S and the memory cell array 110 is long compared to a length lower layer wiring line of the wiring line L between the row driver for reset operation 130R and the memory cell array 110. Now, a definition of a length of the wiring line L is mentioned later. The reason for adopting such a layout is to reduce a load on the memory cell during the set operation. This is mentioned in detail later.

Furthermore, in the example of FIG. 1, a plurality of memory cell arrays 110 are provided to one memory cell array core unit 100, and a region between these plurality of memory cell arrays 110 is provided with the row driver for set operation 130S and the row driver for reset operation 130R. Moreover, the for set operation row driver 130S is shared by these plurality of memory cell arrays 110. On the other hand, the row driver for reset operation 130R is provided one to each of the memory cell arrays 110. This is based on a relationship of previously-described distances Lr and Ls being Ls>Lr.

On the other hand, the column system control circuit comprises a column decoder 160, a column driver 170, a sense amplifier/write buffer 180, and a column system peripheral circuit 190. The column decoder 160 selects a certain column select line based on an address signal. Depending on a selected/unselected state of the column select line, the column driver 170 performs data input/output to a certain number of the bit lines corresponding to the column select line. The sense amplifier/write buffer 180 outputs data inputted via the data input/output signal (I/O) to the column driver 170, and transmits to external data that has appeared in the bit line and received from the column driver 170, as a data input/output signal.

The column system peripheral circuit 190 includes other required row system circuits.

In addition, the column driver 170 comprises a column driver for set operation 170S and a column river for reset operation 170R. The column driver for set operation 170S supplies to a certain number of the bit lines BL a voltage required in a set operation, during the set operation. The column driver for reset operation 170R supplies to a certain number of the bit lines BL a voltage required in a reset operation, during the reset operation. The column driver for set operation 170S and the column driver for reset operation 170R operate selectively based on a control signal provided by the column system peripheral circuit 190.

Moreover, the column driver for set operation 170S is disposed at a position which is far as viewed from the memory cell array 110, compared to the column driver for reset operation 170R. That is, a length Ls' of a wiring line between the column driver for set operation 170S and the memory cell array 110 is longer compared to a length Lr' of the wiring line between the column driver for reset operation 170R and the memory cell array 110. The reason for this is similar to in the case of the row driver 130.

Furthermore, in the example of FIG. 1, a plurality of memory cell arrays 110 are provided to one memory cell array core unit 100, and a region between these plurality of memory cell arrays 110 is provided with the column driver for set operation 170S and the column driver for reset operation 170R. Moreover, the column driver for set operation 170S is shared by these plurality of memory cell arrays 110. On the other hand, the column driver for reset operation 170R is provided one to each of the memory cell arrays 110. This is based on a relationship of previously-described distances Lr' and Ls' being Ls'>Lr'.

[Memory Cell Array]

Figure 2A:
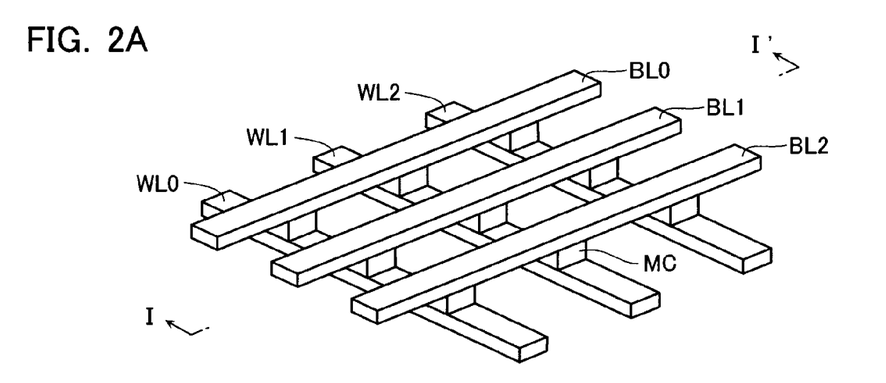
FIG. 2A is an example of a perspective view of part of a memory cell array 110.
Figure 3:
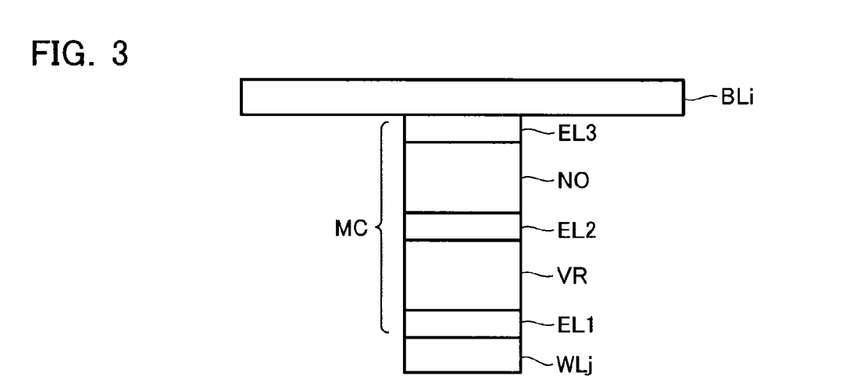
FIG. 3 is an example of a cross-sectional view taken along the line I-I' and looking in the direction of the arrows in FIG. 2A, showing a single memory cell portion.

FIG. 2A is an example of a perspective view of part of the memory cell array 110, and FIG. 3 is an example of a cross-sectional view taken along the line I-I' and looking in the direction of the arrows in FIG. 2A, showing a single memory cell portion.

Figure 2B:
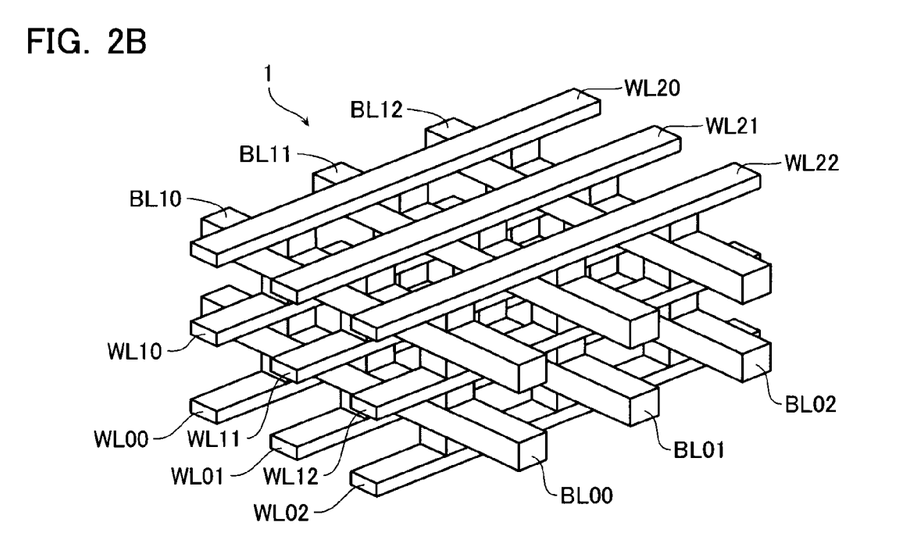
FIG. 2B is an example of a perspective view of part of a memory cell array 110.

Word lines WL0~WL2 acting as a plurality of second lines are arranged in parallel. Bit lines BL0~BL2 acting as a plurality of first lines are arranged in parallel intersecting these word lines WL0~WL2. A Memory cell MC is arranged at each of intersections of these word lines WL0~WL2 and bit lines BL0~BL2 so as to be sandwiched between both lines. The first and second lines are preferably of a material which is heat-resistant and has a low resistance value. For example, W, WSi, NiSi, CoSi, and so on, may be employed as the material of the first and second lines. Note that as in FIG. 2B, it is also possible for four layers of memory cell arrays 110 to be stacked to configure a memory block having a four layer structure. Note also that the number of layers of memory cell arrays is not limited to four.

As shown in FIG. 3, the memory cell MC is configured from a series-connected circuit of a variable resistance element VR and a non-ohmic element NO.

The variable resistance element VR is capable of having its resistance value changed via a current, heat, chemical energy, and so on, by application of a voltage. Electrodes EL1 and EL2 functioning as a barrier metal and an adhesive layer are disposed below and above the variable resistance element VR. The following may be employed as an electrode material, namely Pt, Au, Ag, TiAlN, SrRuO, Ru, RuN, Ir, Co, Ti, TiN, TaN, LaNiO, Al, PtIrOx, PrRhOx, Rh/TaAlN, and so on. In addition, insertion of a metal film to make orientation uniform is also possible. Moreover, inserting a separate buffer layer, barrier metal layer, adhesive layer, and so on, is also possible.

The following may be employed as the variable resistance element VR, namely: an element that has its resistance value changed by a shift in phase between a crystalline state and an amorphous state (PCRAM) such as chalcogenide, or the like; an element that has its resistance value changed by depositing metal cations to form a contacting bridge between electrodes, and ionizing the deposited metal to destroy the contacting bridge (CBRAM); an element where the resistance value changes by application of a voltage or current (broadly divided into an element where a resistance change occurs due to presence/absence of trapped charge in a charge trap existing at an electrode interface, and an element where a resistance change occurs due to presence/absence of a conductive path resulting from oxygen deficiency, or the like) (ReRAM); and so on.

[Specific Configuration of Each Circuit]

A specific configuration of each circuit is described below. Note that the case of a memory cell array 110 configured from 2K bits (=2048 bits) of memory cells MC in a word line direction and 512 bits of memory cells MC in a bit line direction is described as an example.

[Row System Control Circuit]

Figure 4:
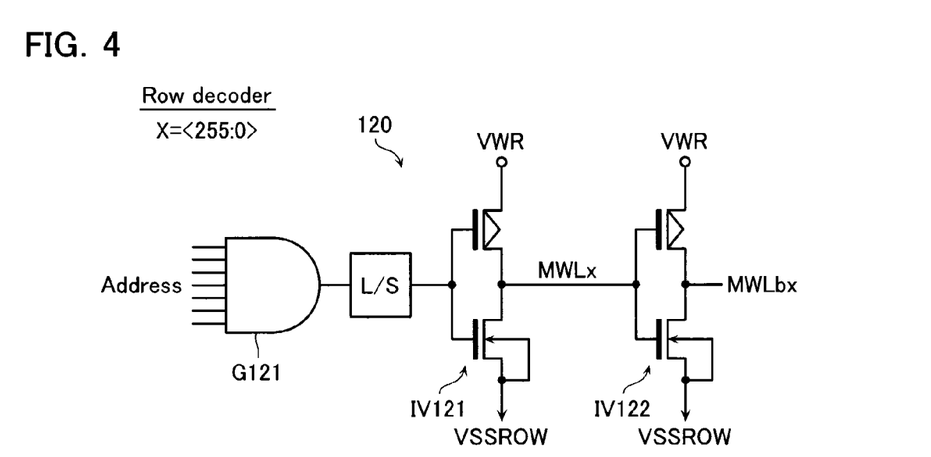
FIG. 4 is an example of a circuit diagram of a main row decoder 120.

FIG. 4 is an example of a circuit diagram of the main row decoder 120. The main row decoder 120 is a pre-decoder that receives input of a row address to select one of 256 pairs of main word lines MWLx and MWLbx (x=<255:0>). Note that the main row decoder 120 includes the circuit shown in FIG. 4 for each of the 256 pairs of main word lines MWLx and MWLbx.

As shown in FIG. 4, one main row decoder 120 is configured by: a NAND gate G121 that receives as input an address signal (Address); a level shifter L/S that level-shifts output of this NAND gate G121; an inverter IV121 that receives as an input signal an output signal of the level shifter L/S; and an inverter IV122 that receives as an input signal an output signal of this inverter IV121. The inverters IV121 and IV122 have their output terminals connected to the main word lines MWLx and MWLbx, respectively. This main row decoder 120 selects a certain x based on the address signal (Address), supplies the selected main word lines MWLx and MWLbx with voltages VSSROW ("H") and VWR ("L"), respectively, and supplies the unselected main word lines MWLx and MWLbx with the voltages VWR and VSSROW, respectively.

Figure 5:
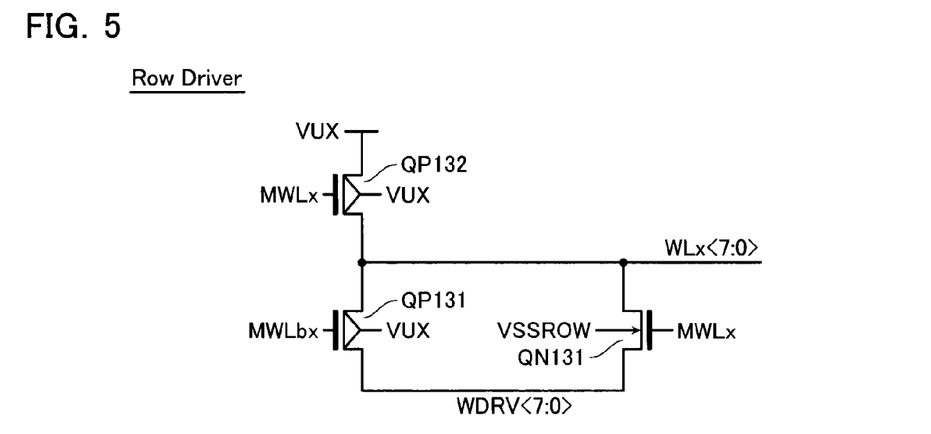
FIG. 5 is an example of a circuit diagram of a row driver 130 (row driver for set operation 130S and row driver for reset operation 130R).

FIG. 5 is an example of a circuit diagram of the row driver 130 (row driver for set operation 130S and row driver for reset operation 130R). The row driver for set operation 130S and the row driver for reset operation 130R may both adopt an identical circuit configuration, hence a structure of the row driver for set operation 130S is described below.

The row driver for set operation 130S shown in FIG. 5 is connected via the wiring line L to any one of word lines WLx<7:0> and is connected to any one pair of the 256 pairs of main word lines MWLx and MWLbx (x=<255:0>).

As shown in FIG. 5, the row driver for set operation 130S comprises two transistors QP131 and QN131. The transistors QP131 and QN131 are connected between write drive lines WDRV<7:0> and the word lines WLx<7:0>, and have connected to their gates the main word lines MWLbx and MWLx, respectively. Moreover, the row driver for set operation 130S comprises a transistor QP132. The transistor QP132 is connected between a power supply line of an unselected word line voltage VUX and the word lines WLx<7:0>, and has connected to its gate the main word lines MWLx.

When the set operation is performed, the row driver for set operation 130S connects either one of the write drive lines WDRV<7:0> or the power supply line of the unselected word line voltage VUX and the word lines WLx<7:0>, depending on a selected/unselected state of the main word lines MWLx. As a result, the word lines WLx<7:0> are supplied with either the selected word line voltage VSSROW or the unselected word line voltage VUX.

Meanwhile, the row driver for reset operation 130R also has a similar configuration. When the reset operation is performed, the row driver for reset operation 130R connects either one of the write drive lines WDRV<7:0> or the power supply line of the unselected word line voltage VUX and the word lines WLx<7:0> via the wiring line L, depending on a selected/unselected state of the main word lines MWLx.

Figure 6:
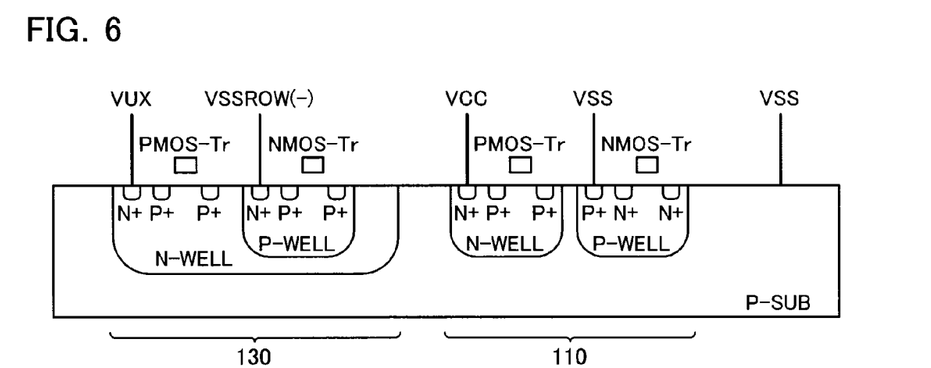
FIG. 6 is an example of a cross-sectional view showing a specific structure of a row driver 130.

Note that the row driver 130 is formed commonly on the same P type substrate as other peripheral circuits, but because it is provided with the selected word line voltage VSSROW being a negative voltage (for example, −0.8 V), has a triple well structure shown in FIG. 6. Specifically, there is a P type substrate having a well voltage of a ground voltage VSS. In addition, a well of N type which is a second conductivity type having a well voltage of the unselected word line voltage VUX is formed on this P type substrate. Then, and a P type well having a well voltage of the selected word line voltage VSSROW is formed on this N type well. An NMOS transistor is formed on this P type well.

Figure 7:
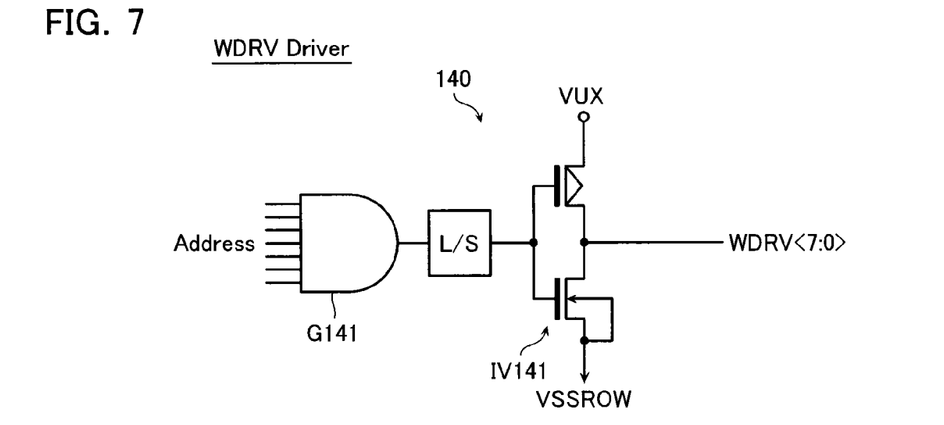
FIG. 7 is an example of a circuit diagram of a write drive line driver 140.

FIG. 7 is an example of a circuit diagram of the write drive line driver 140. The write drive line driver 140 is configured by: a NAND gate G141 that receives as input an address signal (Address); a level shifter L/S that level-shifts output of this NAND gate G141; and an inverter IV141 that receives as input output of this level shifter L/S. This inverter IV141 is provided between the unselected word line voltage VUX and the selected word line voltage VSSROW, and has its output terminal connected to the write drive lines WDRV. This write drive line driver 140 supplies a write drive line WDRV<127:0> corresponding to the inputted address signal with the selected word line voltage VSSROW, and supplies the other write drive lines WDRV<127:0> with the unselected word line voltage VUX. Voltages of these write drive lines WDRV are supplied to the word lines WLx via the row driver 130. Since the main row decoder 120, the row driver 130, and the write drive line driver 140 have the above-described configurations, only the word line WLx selected by the address signal is supplied with the selected word line voltage VSSROW, while other word lines WL are supplied with the unselected word line voltage VUX.

[Column System Control Circuit]

Figure 8:
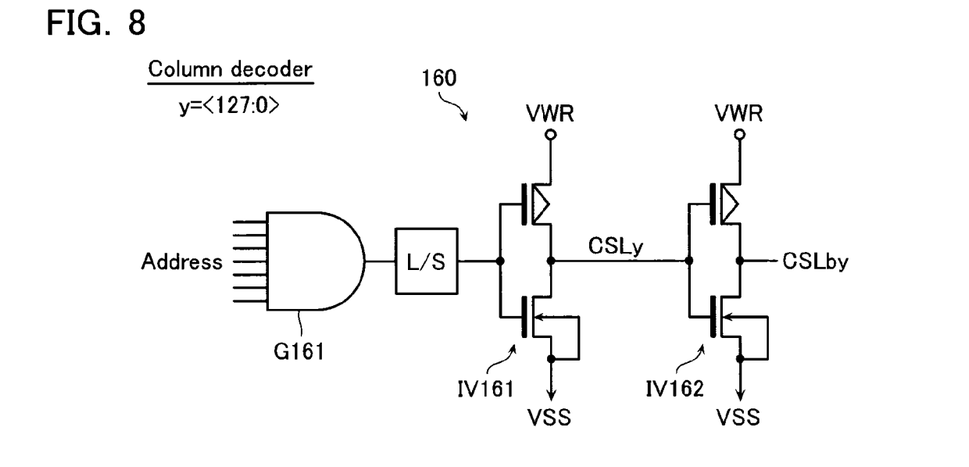
FIG. 8 is an example of a circuit diagram of a column decoder 160.

FIG. 8 is an example of a circuit diagram of the column decoder 160. The column decoder 160 receives input of a column address to select one of 128 pairs of column select lines CSLy and CSLby (y=<127:0>). Note that the column decoder 160 includes the circuit as shown in FIG. 8 for each of the 128 pairs of column select lines CSLy and CSLby. As shown in FIG. 8, one column decoder 160 is configured by: a NAND gate G161 that receives as input an address signal (Address); a level shifter L/S that level-shifts output of this NAND gate G161; an inverter IV161 that receives as input output of this level shifter L/S; and an inverter IV162 that receives as input output of this inverter IV161. Now, the inverters IV161 and IV162 have their output terminals connected to the column select lines CSLy and CSLby, respectively. This column decoder 160 selects a certain y based on the address signal (Address), supplies the selected column select lines CSLy and CSLby with voltages VWR ("H") and VSS ("L"), respectively, and supplies the unselected column select lines CSLy and CSLby with the voltages VSS and VWR, respectively.

Figure 9:
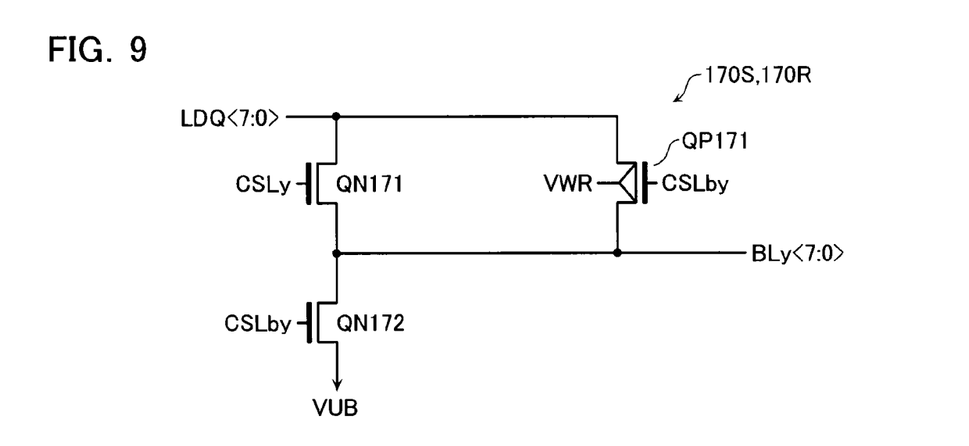
FIG. 9 is an example of a circuit diagram of a column driver 170 (column driver for set operation 170S and column driver for reset operation 170R).

FIG. 9 is an example of a circuit diagram of the column driver 170 (column driver for set operation 170S and column driver for reset operation 170R). The column driver for set operation 170S and the column driver for reset operation 170R may both adopt an identical circuit configuration, hence a structure of the column driver for set operation 170S is described below. The column driver for set operation 170S of FIG. 9 is inputted with any one pair of the 128 pairs of column select lines CSLy and CSLby (y=<127:0>). As shown in FIG. 9, the column driver for set operation 170S comprises: two transistors QP171 and QN171 provided between local data lines LDQ<7:0> and the bit lines BLy<7:0> and controlled by the column select lines CSLy and CSLby, respectively; and a transistor QN172 provided between a power supply line of an unselected bit line voltage VUB and the bit lines BLy<7:0> and controlled by the column select lines CSLby.

This column driver for set operation 170S connects either one of the local data lines LDQ<7:0> or the power supply line of the unselected bit line voltage VUB and the bit lines BLy<7:0>, depending on a selected/unselected state of the column select lines CSLy. Now, a voltage of the local data lines LDQ<7:0> is the selected bit line voltage VWR supplied from the sense amplifier/write buffer 180 or the voltage VSS corresponding to the unselected bit line voltage VUB. As a result, the bit lines BLy<7:0> are supplied with either the selected bit line voltage VWR or the unselected bit line voltage VUB.

Next, an explanation is given of the reason for adopting a layout in which the length Ls (Ls0, Ls1, ..., Lsn) of the wiring line L (L0, L1, ..., Ln) between the row driver for set operation 130S and the memory cell array 110 is made longer compared to the length Lr (Lr0, Lr1, ..., Lrn) of the wiring line L between the row driver for reset operation 130R and the memory cell array 110. Note that the same applies to the reason for adopting a layout in which the length Ls' of the wiring line L between the column driver for set operation 170S and the memory cell array 110 is made longer compared to the length Lr' of the wiring line L between the column driver for reset operation 170R and the memory cell array 110. Hence, the former reason is mainly described below.

Figure 11:
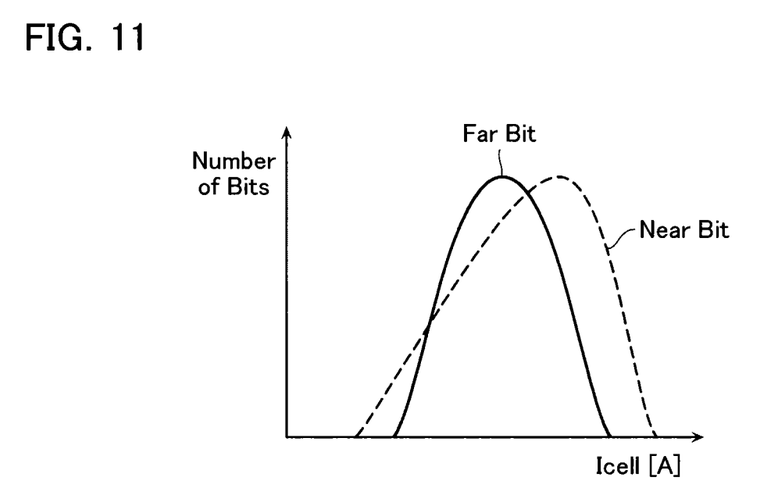
FIG. 11 is an example of a graph explaining advantages of the first embodiment.

In the memory cell array 11, a plurality of memory cells MC are disposed in a matrix, hence there are memory cells MC that are near to the row driver for set operation 130S (referred to below as "near bits") and memory cells MC that are far from the row driver for set operation 130S (referred to below as "far bits"). If the length Ls is small, then variation in an on-current Icell after the set operation in the near bits increases (width of current distribution increases) compared to the far bits. Note that FIG. 11 is a distribution of on-current Icell in a comparative example, and has the length Ls' and the length Lr' of the wiring line L substantially equal. As can be clearly seen in FIG. 11, after the set operation, the distribution of on-current Icell in the plurality of memory cells belonging to near bits is broader than the distribution of on-cell current Icell in the plurality of memory cells belonging to far bits.

The reason why variation in on-current Icell in near bits increases is now explained. As mentioned later, the set operation is an operation for switching a resistance value of the variable resistance element in a memory cell MC from a high-resistance state to a low-resistance state. When the resistance value of the variable resistance element in the memory cell switches to a low-resistance state due to a voltage application, current flowing in the memory cell MC increases. Such the current increasing leads to mistaken operation that a memory cell for which the set operation has been completed conversely ends up being reset (mistaken reset operation), and leads to degrading of the data storing characteristics of the memory cell MC, and application of a large electrical stress to the memory cell MC, and so on. On the other hand, the reset operation is an operation for switching the resistance value of the variable resistance element from a low-resistance state to a high-resistance state, hence it is difficult for the above-described phenomena to occur.

Figure 10A:
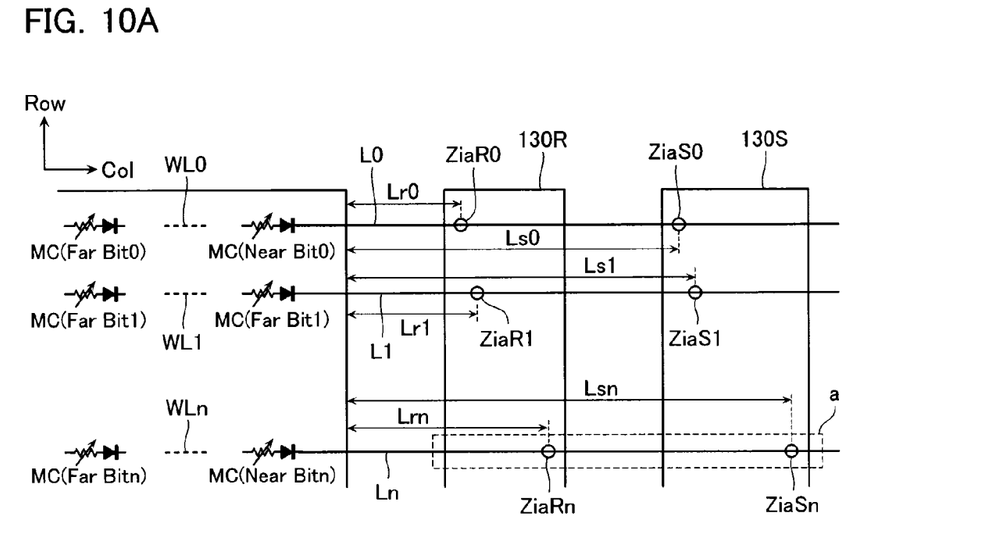
FIG. 10A is a schematic view showing a layout related to a wiring line L in the first embodiment.

Accordingly, as shown in FIG. 10A, the present embodiment adopts a layout in which the length Ls of the wiring line L between the row driver for set operation 130S and the memory cell array 110 is made longer compared to the length Lr of the wiring line L between the row driver for reset operation 130R and the memory cell array 110. Now, the memory cells MC are disposed in a matrix in the memory cell array 110. In FIG. 10A, a memory cell MC connected to the 0-th word line WL0 from an upper side is termed Bit0, and a memory cell MC connected to the n-th word line WLn from the upper side is termed Bitn. Note that n is an integer of 2 or more. Connected to each of the word lines WL0~WLn are a plurality of memory cells MC. The memory cells MC at a far position when viewed from the row driver for reset operation 130R and the row driver for set operation 130S are termed far bits Far Bit0~Far Bitn. On the other hand, the memory cells MC at a near position when viewed from the row driver for reset operation 130R and the row driver for set operation 130S are termed near bits Near Bit0~Near Bitn.

The word lines WL0~WLn are connected to the wiring lines L0~Ln, respectively. The wiring lines L0~Ln extend in a column direction (Col) through the row driver for reset operation 130R to reach the row driver for set operation 130S. Contacts ZiaR0~ZiaRn are disposed in the row driver for reset operation 130R. In addition, contacts ZiaS0~ZiaSn are disposed in the row driver for set operation 130S.

The contacts ZiaR0~ZiaRn are connected via the wiring lines L to the word lines WL0~WLn, respectively. The contacts ZiaS0~ZiaSn are connected via the wiring lines L to the word lines WL0~WLn, respectively. In other words, one contact ZiaRi and one contact ZiaSi are connected via the wiring lines L to each of the word lines WLi (i=0~n). Now, the length Lsi of the wiring lines Li (i=0~n) is a distance from an end (end on a row driver for set operation 130S side) of the memory cell array 110 to the contact ZiaSi. Moreover, the length Lri of the wiring lines Li is a distance from an end (end on a row driver for reset operation 130R side) of the memory cell array 110 to the contact ZiaRi. In addition, for each of the word lines WLi, a relationship of wiring line lengths Lsi>Lri holds. That is, wiring line lengths satisfy Ls0>Lr0, Ls1>Lr1, ..., Lsn>Lrn. Furthermore, lengths of wiring lines Ls0 and Lrn have a relationship of Ls0>Lrn.

Figure 10B:
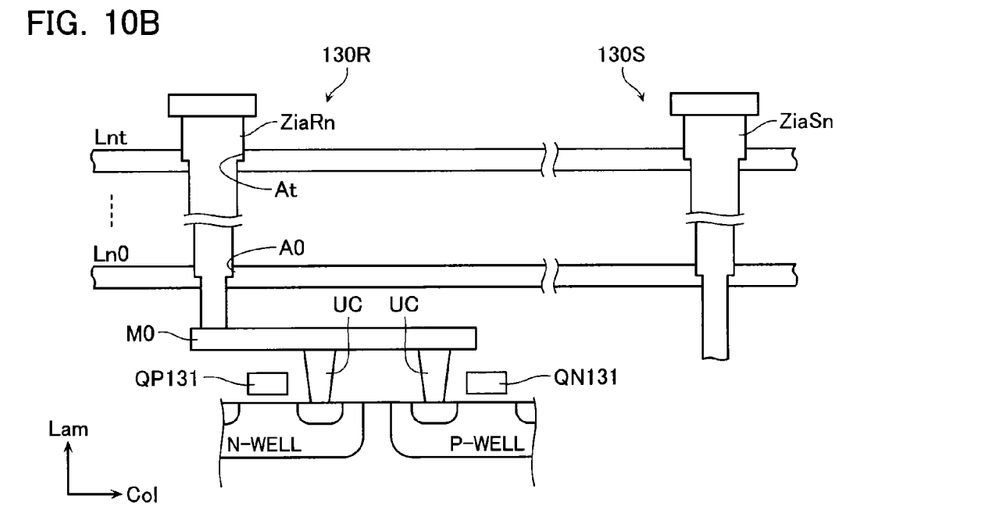
FIG. 10B is a schematic cross-sectional view of the dashed line a portion in FIG. 10A.

An example of a cross-sectional view of the dashed line a portion in FIG. 10A is shown here in FIG. 10B.

As shown in FIG. 10B, the word lines WL have a stacked structure from a 0-th layer to a t-th layer. Note that t is an integer of 2 or more. Similarly, the wiring lines Ln also have a stacked structure from a 0-th layer to a t-th layer (the wiring lines Ln are configured from the wiring lines Ln0~Lnt). The wiring lines Ln0~Lnt are connected to the word lines WLn0~WLnt, respectively. Now, the word lines WLn0~WLnt overlap when viewed from above in FIG. 10A. In other words, the wiring lines Ln0~Lnt shown in FIG. 10B overlap when viewed from above in FIG. 10A.

The contact ZiaRn extends in a direction Lam which is a stacking direction, so as to penetrate each of the wiring lines Ln0~Lnt. Now, the contact ZiaRn extends downwardly in the direction Lam from an opening At formed in an uppermost layer wiring line Lnt. That is, the contact ZiaRn is electrically connected to the wiring line Lnt by contacting a side surface of the opening At of the wiring line Lnt. Similarly, the contact ZiaRn extending downwardly in the direction Lam from the opening At is similarly connected to the wiring lines Ln(t–1), ..., Ln0 disposed in layers below the wiring line Lnt.

Now, the contact ZiaRn extending in the Lam direction from the opening AO of the wiring line Ln0 disposed in a lowermost layer is connected to a wiring line M0. The wiring line M0 is connected to a diffusion layer of each of the transistors QP131 and QN131 by a lower layer contact UC.

The row driver for set operation 130S also has contacts ZiaS0~ZiaSn similar to those of the row driver for reset operation 130R. The contact ZiaSn is also connected to the wiring lines Ln0~Lnt in a similar manner to the contact ZiaRn. Moreover, although not illustrated in the drawings, the contact ZiaSn is also connected to a wiring line at the same level as the wiring line M0, and is connected to a diffusion layer of each of the transistors QP131 and QN131 in the row driver for set operation 130S.

A voltage to be supplied to the memory cell MC is supplied to the memory cell MC from the transistors QP131 and QN131 via the contacts ZiaR and ZiaS and the wiring line L. As a result, the length Ls of the wiring line L becoming longer causes wiring line resistance between the row driver for set operation 130S and the memory cell array 110 to increase. Due to the wiring line resistance of the wiring line L increasing, an increase in the on-current Icell flowing in the memory cell MC after completion of the set operation is suppressed, thereby it is possible to suppress a deterioration of the data storing characteristics of the memory cell MC. Note that a resistance of the contacts ZiaR and ZiaS is smaller compared to the resistance of the wiring line L. Moreover, a length of the wiring line M0 is smaller compared to the length Ls of the wiring line L. Accordingly, wiring line resistance between the transistors QP131 and QN131 and the memory cell array 110 is largely dependent by the lengths Ls and Lr of the wiring line L.

Figure 10C:
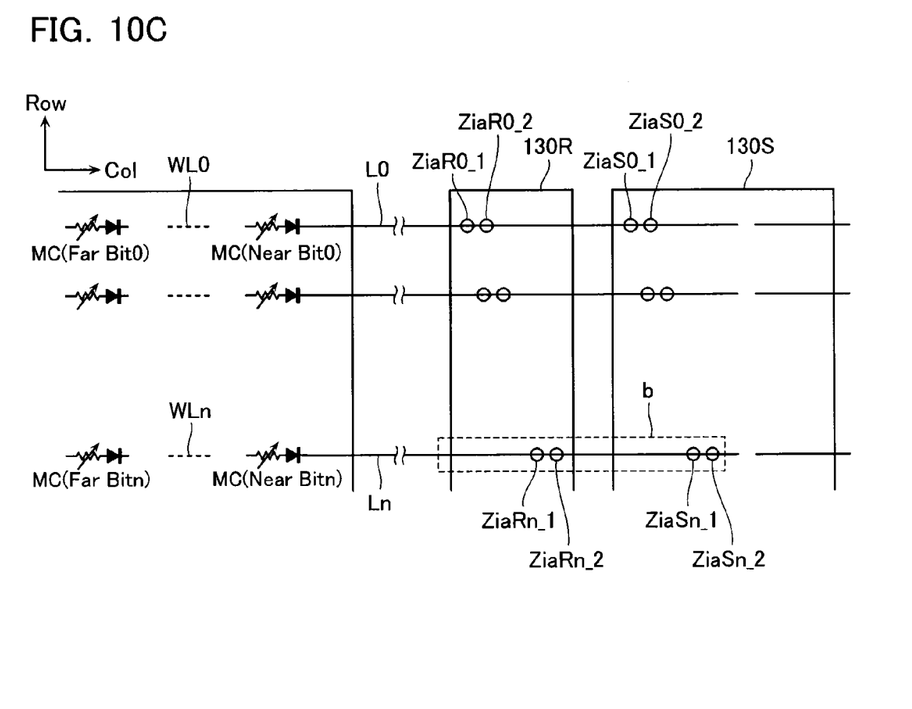
FIG. 10C is a schematic view showing a separate layout related to a wiring line L in the first embodiment.

In addition, as shown in FIG. 10C, it is also possible for four contacts, namely the contacts ZiaRi_1, ZiaRi_2, ZiaSi_1, and ZiaSi_2 to be disposed in each of the wiring lines L0~Ln (i is an integer of 0~n, similarly below). Now, the contacts ZiaRi_1 and ZiaRi_2 are disposed in the row driver for reset operation 130R, and the contacts ZiaSi_1 and ZiaSi_2 are disposed in the row driver for set operation 130S.

Figure 10D:
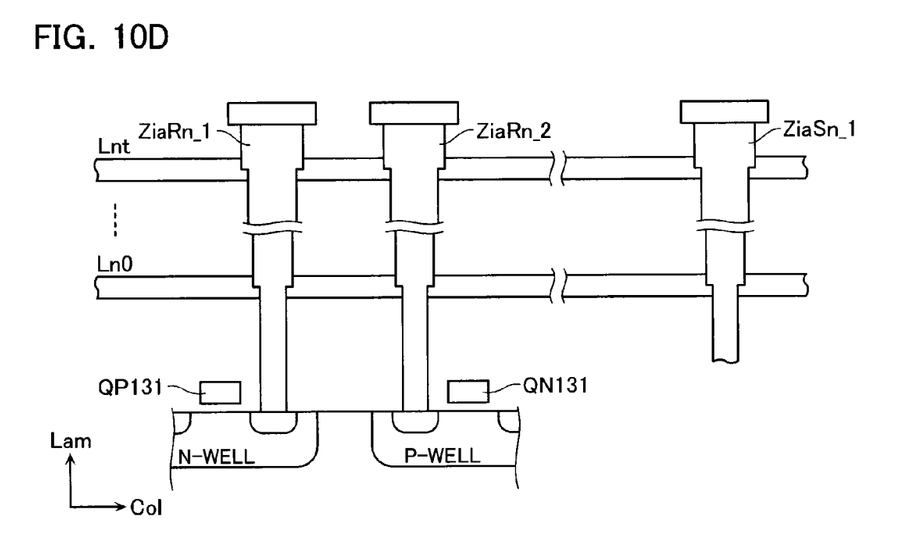
FIG. 10D is a schematic cross-sectional view of the dashed line b portion in FIG. 10C.

The lengths Ls and Lr of the wiring line L are defined by the contacts ZiaRi_1 and ZiaSi_1 nearest to the memory cell array 110 from an end (end on a row driver for set operation 130S side) of the memory cell array 110. An example of a cross-sectional view of the dashed line b portion in FIG. 10C is shown in FIG. 10D. Moreover, a structure of the contacts ZiaRi_1, ZiaRi_2, ZiaSi_1, and ZiaSi_2 is the same as the structure shown in FIG. 10, hence a description thereof is omitted.

The contact ZiaRn_1 is connected to the diffusion layer of the transistor QP131. Moreover, the contact ZiaRn_2 is connected to the diffusion layer of the transistor QN131. In FIG. 10D, contrary to in FIG. 10B, the contact Zia is connected directly to the diffusion layer of the transistor without employing the wiring line M0, but the present embodiment is not limited to this configuration. Moreover, the column driver 170 has a similar layout to that of the row driver 130, hence an explanation thereof is omitted.

Second Embodiment

Figure 12:
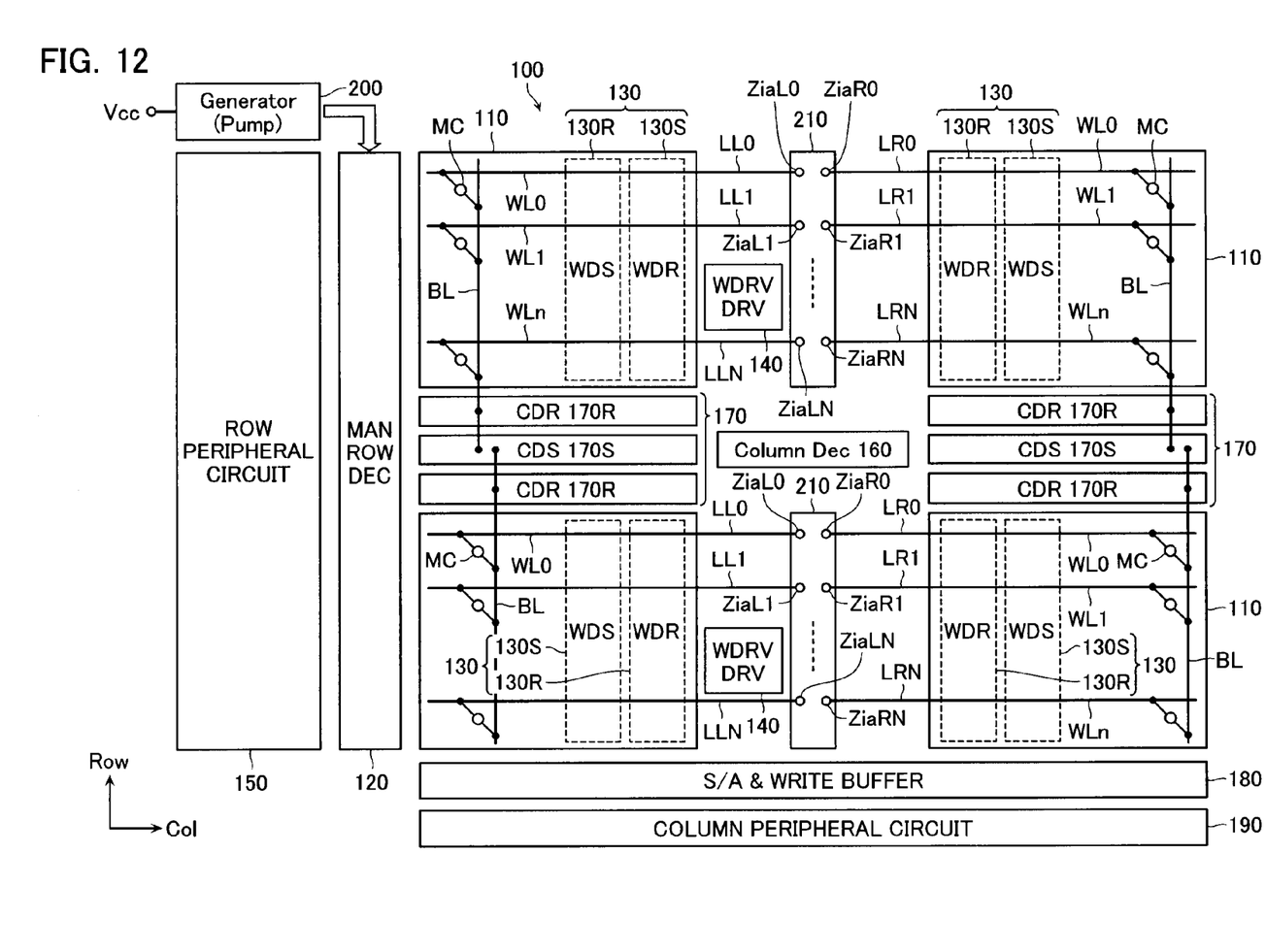
FIG. 12 is an example of a block diagram of a nonvolatile memory according to a second embodiment.

Next, a nonvolatile semiconductor memory device according to a second embodiment is described in detail with reference to the drawings. FIG. 12 is a block diagram of a nonvolatile memory according to the second embodiment. In FIG. 12, configurations identical to those of the first embodiment are assigned with identical symbols to those assigned in the first embodiment, and a detailed description of said configurations is omitted below. In this embodiment, the row driver for set operation 130S and the row driver for reset operation 130R are formed directly below a semiconductor substrate (not illustrated in FIG. 12) where the memory cell array 110 is formed. The row driver for set operation 130S and the row driver for reset operation 130R are connected to the memory cell array 110 via a wiring lines LL0~LLN, LR0~LRN and the contacts ZiaL0~ZiaLN, ZiaR0~ZiaRN extending perpendicularly to the semiconductor substrate. A plurality of contacts ZiaL0~ZiaLn and ZiaR0~ZiaRn are disposed in the via contact region 210. Now, the contacts ZiaL0~ZiaLn are contacts connected to wiring lines LL0~LLn extending from the memory cell array 110 disposed to a left side in the column direction (Col). The contacts ZiaR0~ZiaRn are contacts connected to wiring lines LR0~LRn extending from the memory cell array 110 disposed to a right side in the column direction (Col).

Note that the wiring lines LL0~LLn are connected to the word lines WL0~WLn, respectively, of the memory cell array 110 disposed to the left side in the column direction (Col). The wiring lines LR0~LRn are connected to the word lines WL0~WLn, respectively, of the memory cell array 110 disposed to the right side in the column direction (Col).

Figure 13:
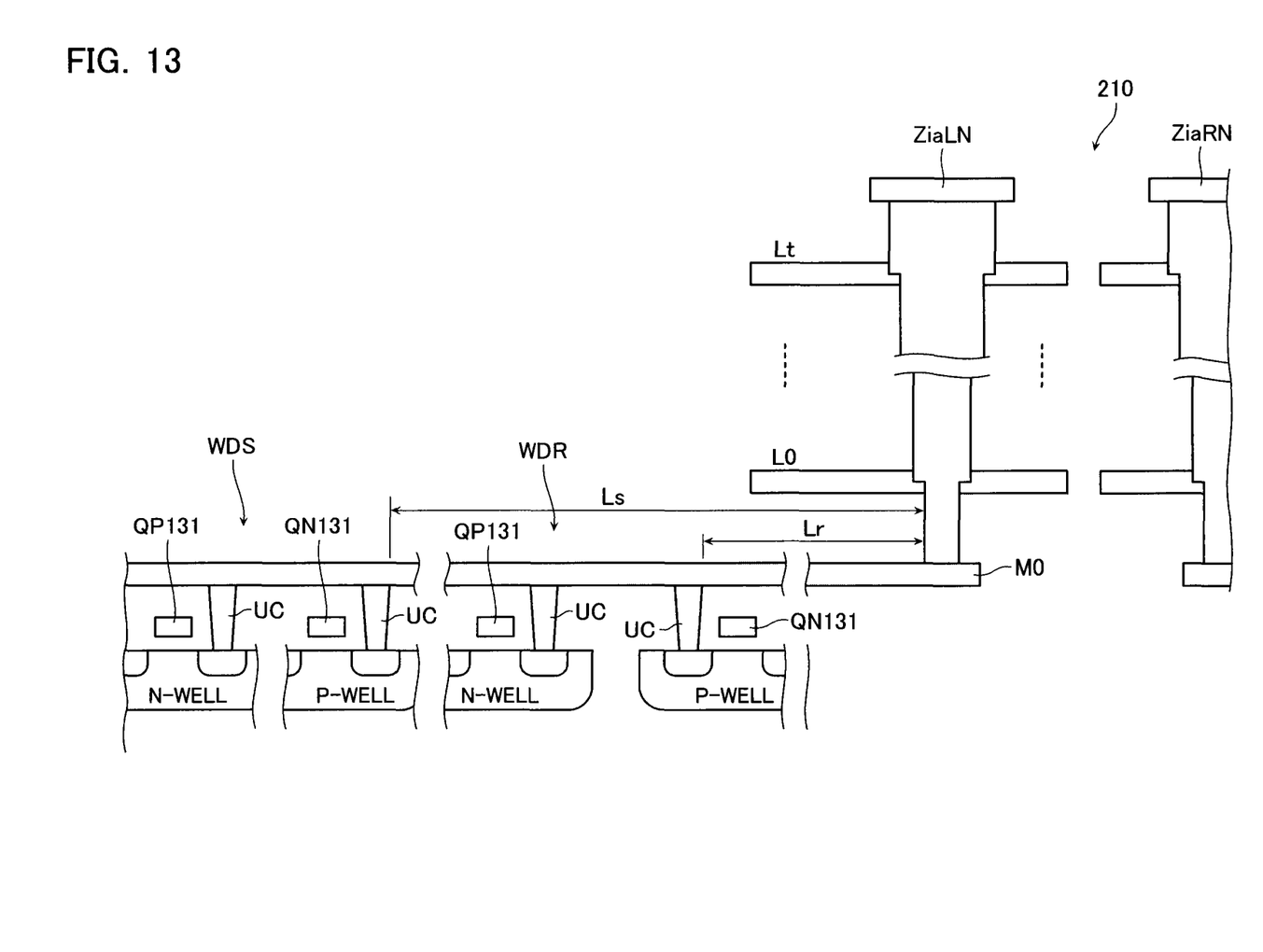
FIG. 13 is a cross-sectional view of a vicinity of a contact ZiaN in FIG. 12.

Now, description proceeds taking the contact ZiaLn as an example. Specifically, as shown in FIG. 13, a bottom surface of the contact ZiaLn is connected to the wiring line M0. The wiring line M0 is connected to each of the transistors QN131 and QP131 of the row driver for set operation 130S, and to each of the transistors QN131 and QP131 of the row driver for reset operation 130R, by the lower layer contact UC. Here, the length Ls of the wiring line L is a distance from a position of contact between the contact ZiaLn and the wiring line M0 to the lower layer contact UC in the row driver for set operation 130S. Moreover, the length Lr of the wiring line L is a distance from a position of contact between the contact ZiaLn and the wiring line M0 to the lower layer contact UC in the row driver for reset operation 130R. Now, although two contacts UC are disposed in the row driver for reset operation 130R and the row driver for set operation 130S, the distances Lr and Ls of the wiring line L are defined as a distance from the contact UC which is nearer to the contact ZiaLn.

Note that a resistance of the contacts ZiaL0~ZiaLN, ZiaR0~ZiaRN is smaller than a resistance of the word line WL and the wiring line CL. Similarly to the first embodiment, the present embodiment adopts a layout in which the length Ls of the wiring line L between the row driver for set operation 130S and the memory cell array 110 is made longer compared to the length Lr of the wiring line L between the row driver for reset operation 130R and the memory cell array 110. Note that FIG. 12 described an example where the row driver for set operation 130S and the row driver for reset operation 130R are formed directly below the semiconductor substrate. However, instead of this, the column driver for set operation 170S and the column driver for reset operation 170R may be formed directly below the semiconductor substrate. Moreover, the row driver for set operation 130S, the row driver for reset operation 130R, the column driver for set operation 170S, and the column driver for reset operation 170R may all be formed directly below the semiconductor substrate.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The wirings L is not limited straight line. The wirings L may be bend between the memory cell array 110 and the contact Zia. In this case, the length Lr of the wiring lines Lr is a wiring length from an end of the memory cell array 110 to the contact Zia.

What is claimed is:

1. A nonvolatile semiconductor memory device, comprising:
    a memory cell array configured as an arrangement of memory cells, the memory cells being disposed at intersections of a plurality of first lines that are disposed in parallel and a plurality of second lines that are disposed intersecting the first lines, and the memory cells each including a variable resistance element;
    a first driver circuit for set operation configured to, when executing on the memory cell a set operation for switching a memory cell from a high-resistance state to a low-resistance state, supply a voltage to the first lines;
    a first driver circuit for reset operation configured to, when executing on the memory cell a reset operation for switching the memory cell from a low-resistance state to a high-resistance state, supply a voltage to the first lines;
    a second driver circuit set operation configured to, when executing the set operation on the memory cell, supply a voltage to the second lines; and
    a second driver circuit for reset operation configured to, when executing the reset operation on the memory cell, supply a voltage to the second lines,
    a length of a wiring line between the first driver circuit for set operation and the memory cell array being longer compared to a length of a wiring line between the first driver circuit for reset operation and the memory cell array, and
    a length of a wiring line between the second driver circuit for set operation and the memory cell array is longer compared to a length of a wiring line between the second driver circuit for reset operation and the memory cell array.

2. The nonvolatile semiconductor memory device according to claim 1, wherein
    the first driver circuit for set operation and the first driver circuit for reset operation are formed in a region between a plurality of the memory cell arrays,
    the first driver circuit for set operation is shared by the plurality of the memory cell arrays, and
    the first driver circuit for reset operation is provided corresponding to each of the plurality of the memory cell arrays.

3. The nonvolatile semiconductor memory device according to claim 1, wherein
    the first driver circuit for set operation and the first driver circuit for reset operation are provided in a region directly below the memory cell array.

4. The nonvolatile semiconductor memory device according to claim 1, further comprising:
    a contact extending in a perpendicular direction to a main surface of a semiconductor substrate, and connecting to the first line,
    wherein the first driver circuit for set operation and the first driver circuit for reset operation are connected to the first lines via the contact.

5. The nonvolatile semiconductor memory device according to claim 4, wherein
    a resistance of the contact is smaller than a resistance of the wiring line between the first driver circuit for set operation and the memory cell array, and is smaller than a resistance of the wiring line between the first driver circuit for reset operation and the memory cell array.

6. The nonvolatile semiconductor memory device according to claim 4, further comprising:
    a via contact region where a plurality of the contacts are disposed; and
    a lower layer wiring line connected to each of the plurality of the contacts,
    wherein the first driver circuit for set operation and the first driver circuit for reset operation are commonly connected to the lower layer wiring line.

7. The nonvolatile semiconductor memory device according to claim 1, further comprising:
    a block having a plurality of layers of the memory cell arrays; and
    a contact,
    wherein the contact commonly connects a plurality of wiring lines that are overlapping when seen in top view.

8. The nonvolatile semiconductor memory device according to claim 4, further comprising:
    a block having a plurality of layers of the memory cell arrays,
    wherein the contact commonly connects the wiring lines that are overlapping when seen in top view.

9. The nonvolatile semiconductor memory device according to claim 7, further comprising:
    a plurality of the contacts,
    wherein one of the contacts connects the plurality of wiring lines to the first driver circuit for set operation or the first driver circuit for reset operation.

10. The nonvolatile semiconductor memory device according to claim 7, further comprising:
    a plurality of the contacts,
    wherein two of the contacts connect the plurality of wiring lines to the first driver circuit for set operation or the first driver circuit for reset operation.

11. The nonvolatile semiconductor memory device according to claim 6, further comprising:
    a plurality of lower layer contacts connected to the lower layer wiring line,
    wherein, of the plurality of lower layer contacts, a first lower layer contact connects the first driver circuit for set operation and the lower layer wiring line, and
    wherein, of the plurality of lower layer contacts, a second lower layer contact connects the first driver circuit for reset operation and the lower layer wiring line.

12. The nonvolatile semiconductor memory device according to claim 11, wherein
    the length of the wiring line between the first driver circuit for set operation and the memory cell array is a distance of the lower layer wiring line from one of the contacts to the first lower layer contact, and
    the length of the wiring line between the first driver circuit for reset operation and the memory cell array is a distance of the lower layer wiring line from one of the contacts to the second lower layer contact.

13. The nonvolatile semiconductor memory device according to claim 9, wherein
    the length of the wiring line between the first driver circuit for set operation and the memory cell array is a distance of the wiring line from an end of the memory cell array on a first driver circuit for set operation to the contact disposed in the first driver circuit for set operation, and
    the length of the wiring line between the first driver circuit for reset operation and the memory cell array is a distance of the wiring line from an end of the memory cell array on a first driver circuit for reset operation to the contact disposed in the first driver circuit for reset operation.

14. A nonvolatile semiconductor memory device, comprising:
- a memory cell array configured as an arrangement of memory cells, the memory cells being disposed at intersections of a plurality of first lines that are disposed in parallel and a plurality of second lines that are disposed intersecting the first lines, and the memory cells each including a variable resistance element;
- a first driver circuit for set operation configured to, when executing on the memory cell a set operation for switching a memory cell from a high-resistance state to a low-resistance state, supply a voltage to the first lines; and
- a first driver circuit for reset operation configured to, when executing on the memory cell a reset operation for switching the memory cell from a low-resistance state to a high-resistance state, supply a voltage to the first lines,
- a length of a wiring line between the first driver circuit for set operation and the memory cell array being longer compared to a length of a wiring line between the first driver circuit for reset operation and the memory cell array,
- the first driver circuit for set operation and the first driver circuit for reset operation being formed in a region between a plurality of the memory cell arrays,
- the first driver circuit for set operation being shared by the plurality of the memory cell arrays, and
- the first driver circuit for reset operation being provided corresponding to each of the plurality of the memory cell arrays.

15. The nonvolatile semiconductor memory device according to claim 14, wherein
the first driver circuit for set operation and the first driver circuit for reset operation are provided in a region directly below the memory cell array.

16. The nonvolatile semiconductor memory device according to claim 14, further comprising:
a contact extending in a perpendicular direction to a main surface of a semiconductor substrate, and connecting to the first line,
wherein the first driver circuit for set operation and the first driver circuit for reset operation are connected to the first lines via the contact.

17. The nonvolatile semiconductor memory device according to claim 16, further comprising:
a via contact region where a plurality of the contacts are disposed; and
a lower layer wiring line connected to each of the plurality of the contacts,
wherein the first driver circuit for set operation and the first driver circuit for reset operation are commonly connected to the lower layer wiring line.

18. The nonvolatile semiconductor memory device according to claim 14, further comprising:
a block having a plurality of layers of the memory cell arrays; and
a contact,
wherein the contact commonly connects a plurality of wiring lines that are overlapping when seen in top view.

19. The nonvolatile semiconductor memory device according to claim 17, further comprising:
a plurality of lower layer contacts connected to the lower layer wiring line,
wherein, of the plurality of lower layer contacts, a first lower layer contact connects the first driver circuit for set operation and the lower layer wiring line, and
wherein, of the plurality of lower layer contacts, a second lower layer contact connects the first driver circuit for reset operation and the lower layer wiring line.

* * * * *